United States Patent [19]

Roesler et al.

[11] 4,297,591

[45] Oct. 27, 1981

[54] ELECTRONIC COUNTER FOR ELECTRICAL DIGITAL PULSES

[75] Inventors: Helmut Roesler; Otto Muehlbauer, both of Munich, Fed. Rep. of Germany

[73] Assignee: Siemens Aktiengesellschaft, Berlin & Munich, Fed. Rep. of Germany

[21] Appl. No.: 51,675

[22] Filed: Jun. 25, 1979

[30] Foreign Application Priority Data

Jul. 28, 1978 [DE] Fed. Rep. of Germany ....... 2833211

[51] Int. Cl.³ .................... H03K 23/08; H03K 21/30; H03K 21/06
[52] U.S. Cl. ............................. 307/224 C; 307/222 C
[58] Field of Search ........... 307/222 C, 225 C, 221 C, 307/223 C, 224 C, 224 R, 222 R, 247 R

[56] References Cited

U.S. PATENT DOCUMENTS

| | | | |
|---|---|---|---|
| 3,277,380 | 10/1966 | Paufve | 307/222 R |
| 3,295,063 | 12/1966 | Felcheck et al. | 307/222 R |
| 3,431,433 | 3/1969 | Ball et al. | 307/221 C |
| 3,500,064 | 3/1970 | Wong | 307/222 C |
| 3,745,372 | 7/1973 | Koster | 307/222 C |
| 3,993,916 | 11/1976 | Copeland et al. | 307/223 C |

OTHER PUBLICATIONS

Grundlagen der Digital-Elektronik und Digitalen Rechentechnik, Second Edition, Unit 1975, p. 176.

*Primary Examiner*—John S. Heyman
*Attorney, Agent, or Firm*—Hill, Van Santen, Steadman, Chiara & Simpson

[57] ABSTRACT

An electronic counter is provided for electrical digital pulses including a counter chain comprising idential flip-flop cells to be controlled by way of a counting input by means of pulses to be counted. By means of each counting pulse given to the counting input, at least one change of the operating state of the first flip-flop cell occurs into the respectively other operating state and in which, in addition, upon a second change of the operating state of the individual flip-flop cells of the counter chain, a simultaneous change of the operating state of at least one flip-flop cell, subsequently connected to the flip-flop cell concerned or, respectively, a resetting of the operating states of all flip-flop cells of the counter chain is provided into an initial state corresponding to the counter reading ZERO. A respective transfer element is provided between two successive flip-flop cells of the counter change, which transfer element determines the counting direction and is provided with a control input to be charged by control signals. Control inputs of the transfer elements which are identical to one another are connected in common to a system which supplies the control signals. The transfer element is provided by means of transistors connected between the outputs of a flip-flop cell and the inputs of the subsequent flip-flop cell, the control electrodes of the transistors being charged by the control signals.

9 Claims, 4 Drawing Figures

ELECTRONIC COUNTER FOR ELECTRICAL DIGITAL PULSES

BACKGROUND OF THE INVENTION

1. Field of the Invention

The present invention relates to an electronic counter for electric digital pulses having a counter chain which is to be controlled by way of pulses applied to a counting input and consisting of flip-flop cells which are identical to one another, and more particularly to a counter in which at least one change of the operating state of a first flip-flop cell into the respectively other operating state occurs in response to each counting pulse and in which, moreover, at every second change of the operating state of the individual flip-flop cells a simultaneous change of the operating state of at least one of the subsequently connected flip-flop cells occurs.

The invention also relates to a counter of the type set forth above in which a resetting of the operating states of all flip-flop cells of the counter is provided to reset the counter to ZERO, and a transfer circuit is provided between two successive flip-flop cells to determine the counting direction and includes a control input for receiving control signals.

2. Description of the Prior Art

Counters of the general type set forth above are known in the art as asychronous forward-backward counters and are described, for example, by Dieter Ulrich in his book *Grundlagen der Digital-Elektronik und Digitalen Rechentechnik*, Second Edition, Munich, 1975, p. 176. In this prior counter, the transfer circuit consists of an interconnection of a plurality of simple logic gates, by means of which the two outputs of a flip-flop cell and the two inputs of the subsequently connected flip-flop cell assigned thereto are connected with one another and which, in turn, is provided with an additional control input. For example, the transfer circuit can be embodied as illustrated in FIGS. 1 and 2, as will be discussed in greater detail below.

A disadvantage of such a construction of the transfer circuit, however, is that a representation in monolithically integrated counters require a great deal of space on the semiconductor chip and, moreover, notably increases the energy consumption of the counter.

SUMMARY OF THE INVENTION

In order to alleviate the aforementioned disadvantage, an electric counter constructed in accordance with the present invention includes a transfer circuit which is provided by transistors connected between the outputs of a flip-flop cell and the inputs of the subsequently connected flip-flop cell, the control electrodes of these transistors being charged by control signals.

To this end, the embodiment of the transistors of the transfer circuit as metal-oxide-semiconductor (MOS) field effect transistors is particularly suitable, in particular as field effect transistors of enhancement type whose source and drain areas are respectively applied to an input or output of the two participating flip-flop cells and whose gate electrodes are charged by a system which supplies the control signals for effecting the transfer.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
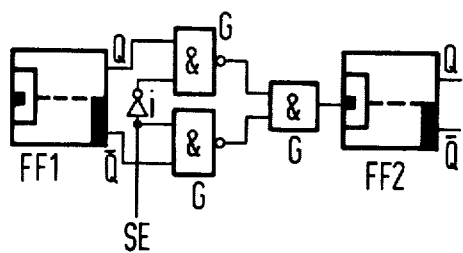
FIG. 1 is a schematic logic diagram of a prior art transfer circuit.
Figure 2:
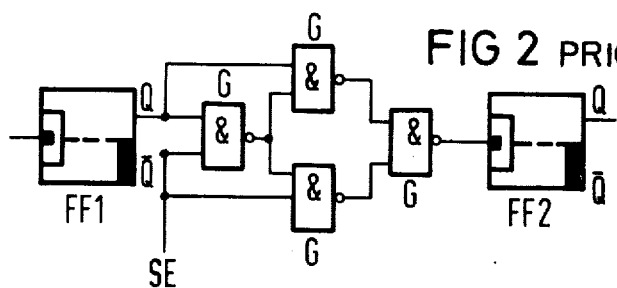
FIG. 2 is a schematic logic diagram of another embodiment of a prior art transfer circuit.
Figure 4:
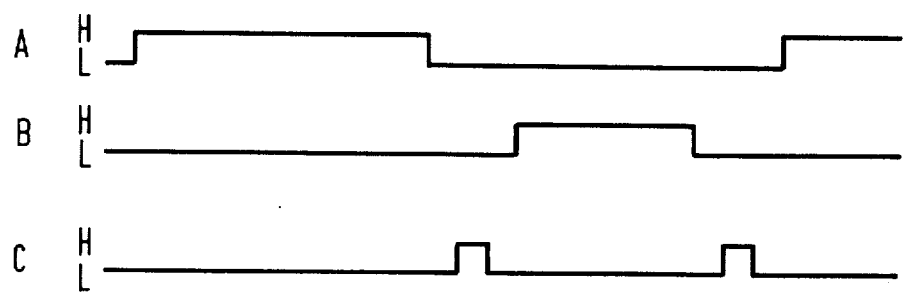
FIG. 4 is a pulse diagram illustrating control signals which are employed in operating the transfer circuit of FIG. 3.
Figure 3:
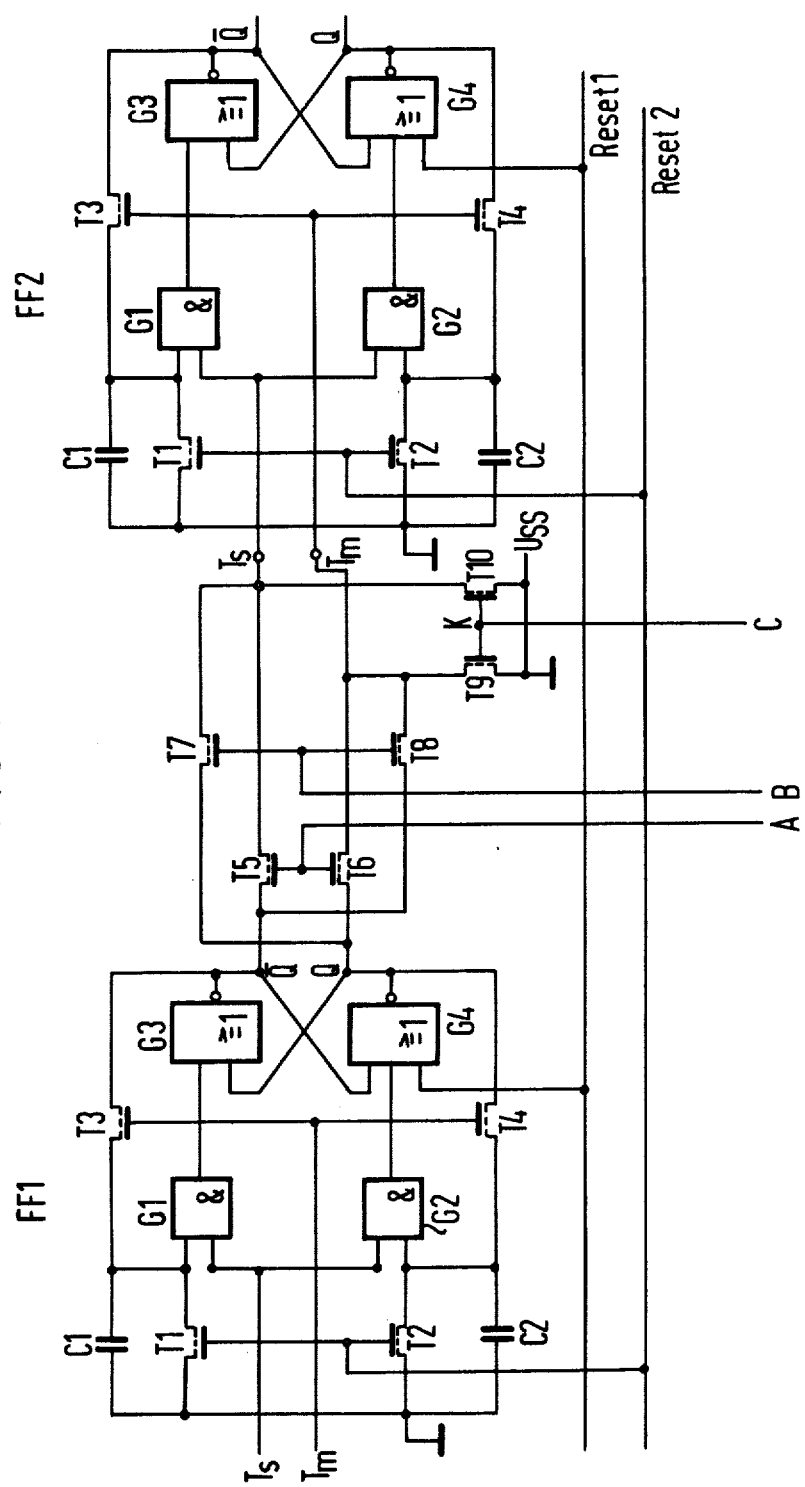
FIG. 3 is a schematic circuit diagram of a transfer circuit contructed in accordance with the principles of the present invention.

In the embodiments illustrated in FIGS. 1–3, the flip-flop cells FF1 and FF2 respectively represent only two successive elements of a counter chain, which in turn may include any number of such elements. Thereby, a respective transfer circuit is provided between each two flip-flop cells.

In the arrangements illustrated in FIGS. 1 and 2, the flip-flop cells are dynamic JK flip-flops which respectively have a Q output and a $\overline{Q}$ output which carry dual signals which are inverted with respect to one another. In addition to the illustrated clock pulse input, two additional signal inputs J and K are provided per flip-flop, as is well known in the art. In the example illustrated in FIG. 1, a transfer circuit is provided by an inverter I and three NAND gates G each having two logic inputs which are connected as illustrated in FIG. 1.

In the arrangement illustrated in FIG. 2, the transfer circuit consists of four NAND gates G, which likewise exhibit two logic inputs. The signal output of the logic gate in the known embodiments illustrated in FIGS. 1 and 2 is applied to the clock input of the subsequently connected flip-flop FF2, whereas the Q output or, respectively the $\overline{Q}$ output of the flip-flop FF1 is connected to one of the two signal inputs of the transfer circuit. The transfer circuit has an additional input SE for receiving control signals which, in the circuit of FIG. 1, directly arrive at the first NAND gate G of the transfer circuit and indirectly arrive at the second NAND gate G by way of the inverter I, whereby the two NAND gates are controlled with respect to their second input by means of a respective output of the flip-flop FF1. In the circuit illustrated in FIG. 2, deviations are provided with respect to the connection of the flip-flop FF1 to the transfer circuit with respect to the circuit of FIG. 1, which should not be necessary to discuss in greater detail here. In FIG. 1, the forward counting direction is provided when a logic "zero" is applied at the input SE of the transfer circuit, whereas the counter counts backwards upon the existence of a logic "one". In the circuit of FIG. 2, the operation is exactly opposite, that is a logic "zero" causes backward counting while a logic "one" causes forward counting.

The object of the electronic transfer circuit is to either switch the Q output or the Q not output of a stage to the clock input of the following counter stage.

Referring now to FIG. 3, an exemplary embodiment of the invention is illustrated in which each signal output of the flip-flop FF1 is connected with the first and second counting inputs of the flip-flop FF2, in pairs by way of the source-drain path of a respective MOS field effect transistor. The gate electrodes of the four field effect transistors are connected to a respective output of a system which supplies transfer signals, in such a manner that each of the counter outputs or, respectively, counter inputs is charged with one of the two outputs of the system which supplies the transfer signals by way of only one single field effect transistor of the four field effect transistors illustrated, that is via the transistors T5-T8.

Therefore, the four transistors are connected as transfer transistors, with whose assistance the shift charges between the input and output of the two participating flip-flops is possible both in the direction from the flip-flop FF1 to the flip-flop FF2, as well as in the reverse direction.

Therefore, for the purpose of changing the counting direction in the counter, the couplings between the counting outputs and the counting inputs of successive counter stages FF1 and FF2 are not fed directly, as is usually the case, but rather by way of the transfer transistors T5 and T6, which are then connected through when their gates are charged with a corresponding logic level. By means of the shunt, consisting of the two transfer transistors T7 and T8, this coupling can be interchanged.

For a further embodiment of the transfer circuit, a further pair of field effect transistors T9 and T10 is provided, by means of whose assistance, in response to a further signal C, the four transfer connections are applied to a potential $U_{ss}$, for example, to ground, and the charge is stored in the transfer circuit can be caused to flow off at a proper time for the next transfer operation. This is particularly important when, as in the case illustrated in FIG. 3, the flip-flops of the counter are designed as master-slave flip-flops.

In these flip-flops, there are two counting inputs which carry the clock pulses $T_m$ and $T_s$ which are inverted with respect to one another. Accordingly, the counting input $T_s$ carries the digital signals inverted with respect to the other counting input $T_m$. Moreover, a respective reset input is provided for the master part and for the slave part of the individual flip-flops of the counter chain. The counting input $T_s$ is connected to a respective signal input of two AND gates G1 and G2, each of which has a second logic input. The counting input $T_m$ is connected to the gate of a field effect transistor T3 whose source is connected to the second input of the first AND gate G1. The counting input $T_m$, moreover, is connected to the gate of a further field effect transistor T4 whose source is connected with the second input of the second AND gate G2. The second inputs of the two AND gates G1 and G2 and, therefore, the sources of the two field effect transistors T3 and T4 are connected by way of a respective parallel connection of the source-drain path of a field effect transistor T1 or, respectively, T2 having a respective capacitor C1 and C2 and parallel therewith, to a common reference potential, particularly to ground. The gates of the two field effect transistors T1 and T2 are connected with one another and to a reset line Reset 2 which appertains to all flip-flops of the counter chain and which carries the signals necessary for resetting the master parts of the flip-flops into the initial condition "zero".

The signal output of the first AND gate G1 is connected to a signal input of a first NOR gate G3, and the signal output of the second AND gate G2 is connected to a signal input of a second NOR gate G4. The signal output of the first NOR gate G3 forming the $\overline{Q}$ output of the flip-flop FF1 or, respectively, FF2 is connected with the drain of the field effect transistor G3 and the signal output of the second NOR gate G4 forming the Q output of the flip-flop is connected with the drain of the field effect transistor T4. Moreover, the second input of the first NOR gate G3 is connected to the signal output of the second NOR gate G4 and the second input of the NOR gate G4 is connected to the signal output of the first NOR gate G3, so that the two NOR gates G3 and G4 forming the central portion of the slave part are cross-coupled with one another. The last input of the NOR gate G4 is connected to a further reset line Reset 1 appertaining to all flip-flops of the counter in which the reset signal is required for resetting the slaves into the initial condition are fed.

The description up to this point concerns the construction of a standard master-slave flip-flop whose manner of operation is well known in the art. The part which is of significance for the present invention, by contrast, is provided by the transfer circuit as briefly discussed above, which is connected between the flip-flops FF1 and FF2.

The transfer circuit contains six field effect transistors T5-T10. The Q output of the flip-flop FF1 is connected with $T_m$ input of the flip-flop FF2 by way of the source-drain path of the transistor T6 and is connected with the $T_s$ input of the flip-flop FF2 by way of the source-drain path of the transistor T7. The $\overline{Q}$ output of the flip-flop FF1 is connected to the $T_s$ input of the flip-flop FF2 by way of the source-drain path of the transistor T5 and is connected to the $T_m$ input of the following flip-flop FF2 by way of the transistor T8. The gate electrodes of the transistors T5 and T6 are controlled by means of a common, first signal A, while the gate electrodes of the transistors T7 and T8 are likewise controlled by means of a common, second signal B.

The two additionally mentioned field effect transistors T9 and T10 are controlled in common by way of their gate electrodes by a control signal C and are connected to a bleeder potential $U_{ss}$ with their sources, whereas the drain of the transistor T9 is connected to the input $T_m$ and the drain of the transistor T10 is connected to the input $T_s$ of the subsequently connected flip-flop and, therefore, the drains of the transistors T9 and T10 are connected to the drains of the transistors T6, T8 and T5, T7, respectively.

It should be observed that the individual field effect transistors are designed as uniformly as possible. Preferably, the transistors are of the enhancement type, particularly transistors of the n-channel type are exclusively employed. Moreover, it is to be understood that the counter and, therefore, the flip-flops FF1 and FF2, together with the transfer circuit located therebetween can be unified without further operation in a monolithically integrated semiconductor circuit.

As can be seen from FIG. 3, the couplings between directly successive stages FF1 and FF2 of the counter are not fed directly as is usual, but rather by way of two transfer transistors T5 and T6 by means of which the forward counting direction is switched on and which are then connected through when a logic "one" is applied to their gate electrodes which are commonly connected to receive the control signal A. By means of a simple shunt consisting of the two transfer transistors T7 and T8, this coupling can be interchanged. Thereby, it is provided that the two transistors T9 and T10 for a discharge stage in that, control by means of the common signal C, they sometimes become conductive so that the master parts of the flip-flops FF1 or, respectively, FF2 can briefly arrive at the potential $V_{ss}$ (ground potential) and the electric charges still present from a preceding operating state are equalized.

The transfer effected by way of the transfer circuit cannot always be carried out when the counter is fully charged and, therefore, a logic "one" is applied in all flip-flops of the counter, because a logic "zero" was set by way of the reset lines Reset 1 and Reset 2. In this case, the charge killer K can be eliminated. In every other case, the discharge stage K is necessary in that, otherwise, the flip-flops of the counter would assume any desired position as a reaction to the transfer as a result of the stored charges.

A timing diagram of the pulses A, B and C to be employed upon actuation of the transfer circuit is illustrated in FIG. 3. The signal A serves to change the counter to the forward counting direction. It is a continuous signal which is applied to the gate of the two transistors T5 and T6 to render these transistors conductive. If one is to transfer to the backwards counting direction, the signal A is interrupted and the signal B is switched on, by means of which the transistors T7 and T8 are activated. The signal C which is necessary for charging the two killer transistors T9 and T10 in the discharge stage K appears between the two signals A and B. Therefore, a system which automatically generates the signals A, B and C must be designed in such a manner that the interruption to be undertaken randomly first triggers the generation of a killer signal C and only then triggers the generation of the transfer signal A or the transfer signal B, respectively, required for the transfer to the opposite counting direction.

The employment of a counter of the type described, as already indicated, is favorable as an amplitude reducer for an electronic organ in that the sound amplitudes in electronic organs first increase beginning from zero and later again decrease from the sound maximum. To that end, one of the counters described is employed with a R-2 R-network. One input is applied to the sound frequency, while the other is connected to ground or, preferably, to a mean potential. The reduced sound amplitude appears at the output. It then oscillates about a mean value when one input was applied to a mean value. The displacement around the mean value causing the switch-on click can be avoided in this manner.

Otherwise, the counter is employed in the same manner as known asychronous forward-backward counters.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a counter of the type in which a plurality of flip-flops each having a pair of inputs and a pair of outputs are provided in a chain connection and a plurality of transfer circuits are respectively interposed between successive flip-flops, the improvement wherein each of said transfer circuits comprises:

a plurality of transfer transistors having conduction paths connected between the outputs of one flip-flop and the inputs of the subsequently connected flip-flop and control electrodes for receiving control signals to determine the direction of counting, said plurality of transfer transistors comprising a first field effect transistor including a source-drain path connected between a first output of a first flip-flop and a first input of a next successive, second flip-flop, and a gate connected to receive a forward count control signal;

a second field effect transistor including a source-drain path connected between a second output of the first flip-flop and a second input of the second flip-flop, and a gate connected to receive the forward count control signal;

a third field effect transistor including a source-drain path connected between said second output and said first input, and a gate connected to receive a backward count control signal; and a fourth field effect transistor including a source-drain path connected between said first output and said second input, and a gate connected to receive the backward count control signal.

2. The improved counter of claim 1, further defined as each of said transfer circuits comprising:

a discharge circuit connected between said first and second inputs and a reference potential, and including a control input connected to receive a discharge control signal.

3. The improved counter of claim 2, wherein said discharge circuit is defined as comprising:

a first field effect discharge transistor including a source-drain path connected between said first input and the reference potential, and a gate connected to receive the discharge control signal; and a second field effect discharge transistor including a source-drain path connected between said second input and the reference potential, and a gate connected to receive the discharge control signal.

4. The improved counter of claim 3, wherein said counter, including said field effect transistors, is constructed as a monolithically integrated semiconductor circuit.

5. In a monolithic integrated semiconductor asychronous forward-backward counter in which a plurality of master-slave flip-flops each having first and second inputs and first and second outputs have transverse circuits therebetween connecting the outputs of a flip-flop to the inputs of the next successive flip-flop, the improvement wherein:

each of said transfer circuits is integrated with the flip-flops and comprises a first pair of metal-oxide-semiconductor field effect transistors each including a source-drain path and a gate with said source-drain paths connected between a first output of a first flip-flop and a first input of a second, next subsequent, flip-flop, and a second output of said flip-flop and a second input of said second flip-flop, respectively, and their gates connected together to receive a forward count control signal, a second pair of metal oxide-semiconductor field effect transistors each including a source-drain path and a gate with the source-drain paths cross-connected with respect to said first pair of metal-oxide-semiconductor field effect transistors between a first output of said first flip-flop and a second input of said second flip-flop and a second output of said first flip-flop and a first input of said second flip-flop, respectively, and their gates connected together to receive a backwards count control signal, and a third pair of metal-oxide-semiconductor field effect transistors each including a source, a drain and a gate, said drains connected to respective first and second inputs of said second flip-flop, said sources connected to a reference potential and said gates connected together to receive a discharge control signal.

6. The improved counter of claim 5, wherein each of said flip-flops comprises:

an input portion including first and second AND gates each having first and second inputs and an output, said first inputs connected together to constitute a first input of the flip-flop, first and second capacitors respectively connecting said second inputs of said AND gates to a reference potential, and first and second metal-oxide-semiconductor field effect transistors each having a source-drain path connecting said first and second outputs of said flip-flop to said first inputs of said AND gates, and commonly connected gates connected as said second input of said flip-flop; and an output portion comprising a RS flip-flop including a pair of cross-coupled gates each having an output constituting a respective output of said flip-flop and an input connected to a respective output of a respective AND gate.

7. The improved counter of claim 6, wherein said input portion further comprises third and fourth field effect transistors each having a source-drain path bridging respective capacitors and a gate connected in common to the light gate of the other to receive a common reset signal and wherein:

one of said cross-coupled gates of said output portion includes a reset input connected to receive another reset signal.

8. The improved counter of claim 7, wherein:

said cross-coupled gates comprise a pair of NOR gates.

9. The improved counter of claim 8, wherein all of said metal-oxide-semiconductor transistors are enhancement type transistors.

* * * * *